United States Patent
Stephens et al.

(10) Patent No.: US 8,291,257 B2
(45) Date of Patent: Oct. 16, 2012

(54) APPARATUS AND METHOD TO COMPENSATE FOR INJECTION LOCKING

(75) Inventors: Samuel G. Stephens, Austin, TX (US); Kenneth R. Burch, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 382 days.

(21) Appl. No.: 12/748,892

(22) Filed: Mar. 29, 2010

(65) Prior Publication Data
US 2011/0234277 A1  Sep. 29, 2011

(51) Int. Cl.
*G06F 1/00* (2006.01)
*G06F 1/04* (2006.01)

(52) U.S. Cl. ........ 713/600; 713/500; 375/371; 375/346; 327/158

(58) Field of Classification Search .................. 713/500, 713/600; 375/346, 371; 327/158
See application file for complete search history.

(56) References Cited

U.S. PATENT DOCUMENTS

| | | | |
|---|---|---|---|
| 4,049,953 A * | 9/1977 | Evans, Jr. ................... | 708/101 |
| 5,717,730 A | 2/1998 | Prakash et al. | |
| 7,880,551 B2 * | 2/2011 | Chan et al. ................... | 331/55 |
| 2005/0152488 A1 | 7/2005 | Buckwalter et al. | |
| 2008/0211554 A1 | 9/2008 | Cho et al. | |
| 2008/0285598 A1 * | 11/2008 | Farbarik et al. .............. | 370/516 |

FOREIGN PATENT DOCUMENTS

| EP | 0575058 A1 | 12/1993 |
|---|---|---|
| WO | 2008033663 A1 | 3/2008 |

OTHER PUBLICATIONS

PCT Application No. PCT/US2011/025872, International Search Report and Written Opinion dated Oct. 5, 2011.
"Injection-Locked Clocking"; http://www.ece.rochester.edu/research/laics/ilc.html; Laboratory for Advanced Integrated Circuits and Systems, University of Rochester.
Hossain, M. et al.; "CMOS Oscillators for Clock Distribution and Injection-Locked Deskew"; IEEE Journal of Solid-State Circuits; Aug. 2009; pp. 2138-2153; vol. 44, No. 9, IEEE.
Lee, J. et al.; "Subharmonically Injection-Locked PLLs for Ultra-Low-Noise Clock Generation"; ISSCC; 2009; 3 pgs; IEEE.

* cited by examiner

*Primary Examiner* — Mark Connolly

(57) ABSTRACT

A circuit and method has a processing unit, a master clock generator for providing a master clock and a plurality of phase-locked loops, each providing a respective clock signal. A plurality of dynamically variable delay circuits each has a plurality of predetermined delay amounts. Clocked circuits are coupled to respective clock signals provided by respective phase-locked loops. A performance detector is coupled to receive the clock signals for determining a center of a quiet zone for at least one of the plurality of phase-locked loops. The phase-locked loops are turned off and on and a respective one of the plurality of dynamically variable delay circuits is set to have a new predetermined value of delay which adjusts an edge of the master clock to a location that permits the data processing system to operate near substantially the center of the quiet zone.

20 Claims, 5 Drawing Sheets

APPARATUS AND METHOD TO COMPENSATE FOR INJECTION LOCKING

BACKGROUND

1. Field

This disclosure relates generally to data processing systems, and more specifically, to a data processing system having compensation for injection locking.

2. Related Art

A data processing system may require multiple clock signals for certain applications. Typically, a number of phase-locked loops (PLLs) may be used to generate the clock signals. PLLs are designed to keep the output clock signal in phase with the phase of a reference clock signal. When these PLLs's oscillators are operating at the same frequency or harmonically related frequencies, the oscillators can "injection lock." Injection locking may pull the PLL output clock signals to not operate in a phase-aligned manner with their respective reference clock signals. This conflict between the inherent operation of the PLLs and injection locking can result in the PLLs generating clock signals with an unacceptable level of jitter.

Typically, this conflict has been resolved by isolating the PLLs to reduce the coupling between the PLLs to an insignificant level. However, isolating the PLLs is no longer an effective solution due to two factors. First, systems utilizing PLLs are increasingly operating at high frequencies, which can result in a higher sensitivity to jitter. Second, the distance between the PLLs is reducing making isolation ineffective.

Accordingly, there is a need for an apparatus and method to compensate for injection locking.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
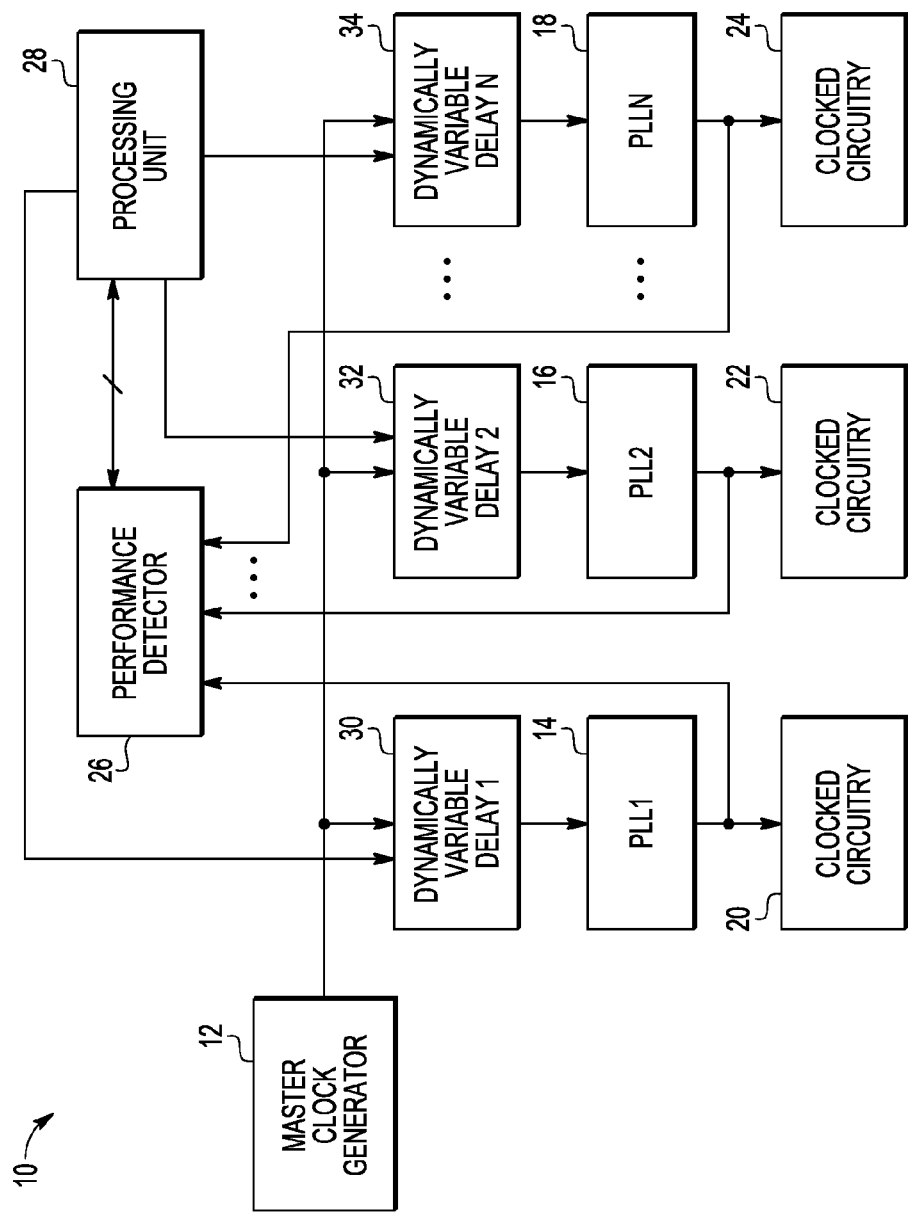
FIG. 1 is a block diagram of an exemplary data processing system with an apparatus to compensate for injection locking.

In one aspect, a method to compensate for injection locking in a data processing system having a plurality of phase-locked loops coupled to a master clock, each of the plurality of phase-locked loops providing a respective clock signal to respective clocked circuitry, is provided. The method may include turning on at least two of the plurality of phase-locked loops. The method may further include setting a dynamically variable delay circuit that is between the master clock and one of the at least two of the plurality of phase-locked loops to have a predetermined value of delay, the dynamically variable delay circuit having a plurality of delay values. The method may further include measuring performance of at least one of the plurality of phase-locked loops with the plurality of delay values to provide a plurality of performance values. The method may further include determining a center of a quiet zone of phase difference between clocks of the at least two of the plurality of phase-locked loops. The method may further include adjusting, if necessary, a currently selected temporary delay value for the one of the at least two of the plurality of phase-locked loops to an adjusted new temporary delay value that corresponds to substantially the center of the quiet zone. The method may further include during operation of the data processing system, turning off the at least two of the plurality of phase-locked loops and repeating (a) through (f).

In another aspect, a data processing system is provided. The data processing system may include a master clock generator for providing a master clock. The data processing system may further include a plurality of phase-locked loops coupled to the master clock generator, each of the plurality of phase-locked loops providing a respective clock signal. The data processing system may further include a plurality of dynamically variable delay circuits, each coupled between the master clock generator and a respective one of the plurality of phase-locked loops and having a plurality of predetermined delay amounts. The data processing system may further include a plurality of clocked circuitry portions comprising respective clocked circuits coupled to the respective clock signal of a predetermined one of the plurality of phase-locked loops. The data processing system may further include a performance detector coupled to the plurality of clocked circuitry portions for determining a center of a quiet zone of phase difference between clocks of at least two of the plurality of phase-locked loops. The data processing system may further include a processing unit coupled to the performance detector and the plurality of dynamically variable delay circuits, the processing unit selectively turning off the at least two of the plurality of phase-locked loops, turning on the at least two of the plurality of phase-locked loops and setting a respective one of the plurality of dynamically variable delay circuits to have a new predetermined value of delay which readjusts delay to a value that adjusts an edge of the master clock to a location that permits the data processing system to operate near substantially the center of the quiet zone.

In yet another aspect, a method may include providing a master clock signal to at least a first phase-locked loop and a second phase-locked loop. The method may further include injecting a predetermined variable delay to the master clock signal prior to said providing the master clock signal to the second phase-locked loop. The method may further include providing first and second clock signals respectively to first and second clocked circuits respectively from the first phase-locked loop and the second phase-locked loop. The method may further include measuring performance of the first and second clock signals in response to delaying the master clock signal to the second phase-locked loop using a plurality of differing delay values resulting in a plurality of performance values. The method may further include determining a center of a quiet zone of phase difference between the first and second clock signals. The method may further include adjusting, if necessary, a currently selected temporary delay value for the master clock signal coupled to the second phase-locked loop to an adjusted new temporary delay value that corresponds to substantially the center of the quiet zone. The method may further include selectively repeating said measuring, determining and adjusting during functional operation of the first and second clocked circuits.

FIG. 1 is a block diagram of an exemplary data processing system 10 with an apparatus to compensate for injection locking. In one embodiment, data processing system 10 may include a master clock generator 12, PLL1 14, PLL2 16, and PLLN 18. Data processing system 10 may further include clocked circuitry 20, 22, and 24. Data processing system 10 may further include a performance detector 26, a processing unit 28, dynamically variable delay1 30, dynamically variable delay2 32, and dynamically variable delayN 34. Master clock generator 12 may be an oscillator that can generate a clock signal for use with the various PLLs. In one embodiment, the master clock signal generated by master clock generator 12 may be coupled as an input to dynamically variable delay1 30, dynamically variable delay2 32, and dynamically variable delayN 34, respectively. By way of example, each of the dynamically variable delays may be implemented as a delay line with multiple taps. The output of each of the dynamically variable delays may be coupled to a respective PLL. PLL1 14 may be used to provide a clock signal to clocked circuitry 20. PLL2 16 may be used to provide a clock signal to clocked circuitry 22. PLLN 18 may be used to provide a clock signal to clocked circuitry 24. In this embodiment, the clock signals output by the PLLs may be provided as an input to performance detector 26. Performance detector 26 may perform jitter measurements on the clock signals to determine an amount of the jitter in the respective clock signals. Thus, jitter measurements may be used by performance detector 26 to evaluate the performance of the various clocking signals. Performance detector 26 may be coupled to processing unit 28, such that processing unit may exchange information with performance detector 26. By way of example, processing unit 28 may store jitter measurements received from performance detector 26. Although FIG. 1 shows a specific number of components arranged in a certain manner, data processing system 10 may include additional or fewer elements, arranged differently. In one embodiment, data processing system 10 is implemented on a single integrated circuit, such that all components of data processing system 10, shown in FIG. 1, except for master clock 12, are on the same integrated circuit.

Figure 2:
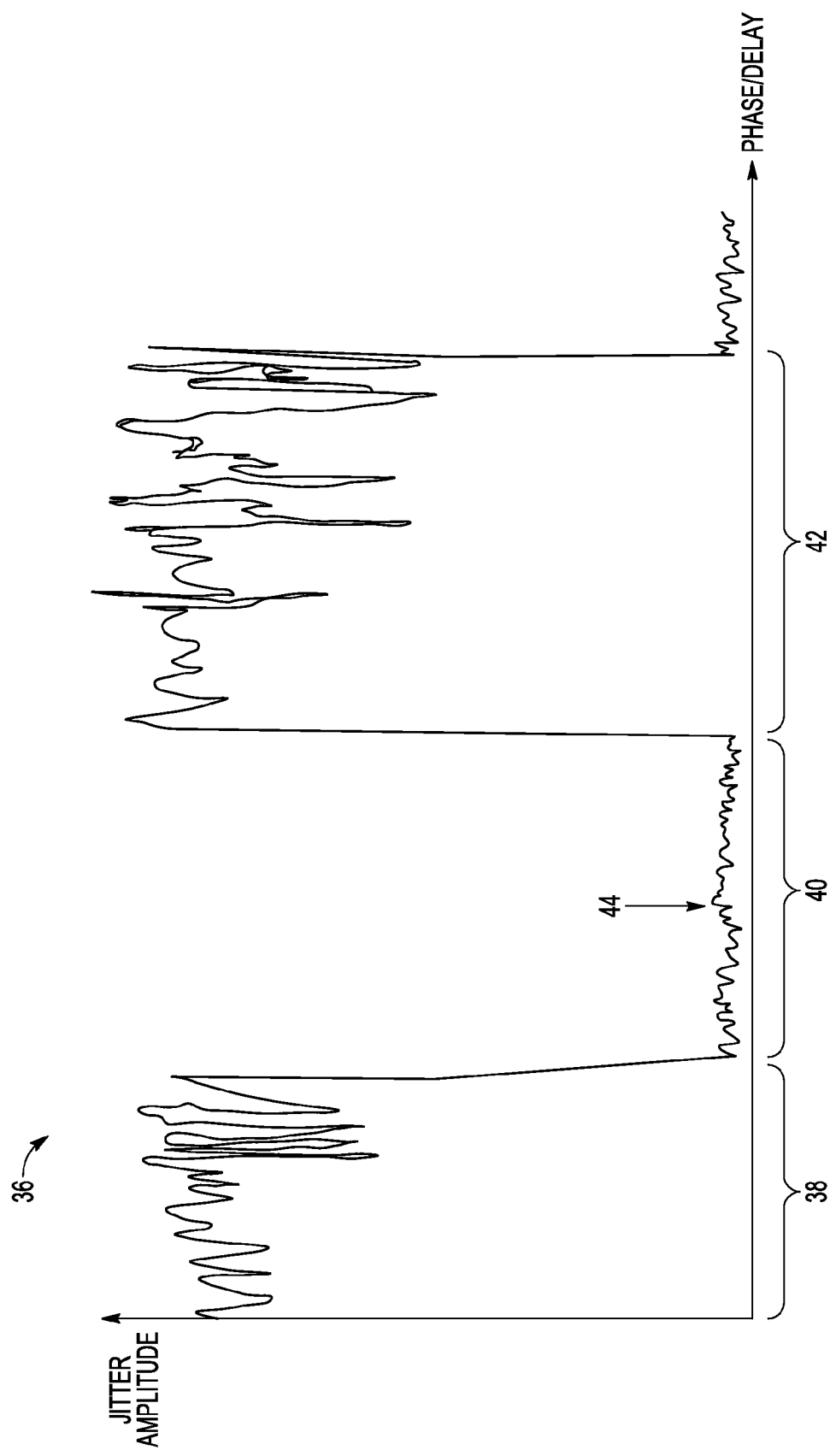
FIG. 2 is a schematic diagram showing variation in an amplitude of the clock jitter based on a variation of the phase/delay of the reference clock signal.

As explained later with respect to FIGS. 2 and 3, processing unit 28 may execute an algorithm to adjust dynamically variable delay values, as needed. The dynamically variable delay values are temporary values and may be changed by processing unit 28 during operation of data processing system 10. As used herein, the phrase "operation of the data processing system" includes operation of data processing system 10 during testing and during deployment in an end-user product. The ability to change the temporary values associated with the dynamically variable delay values is critical because a fixed permanent delay value does not solve the problem created by the conflict between the inherent nature of PLLs and injection locking. This is because changes in process, voltage, or temperature can create enough phase shift in a clock signal that the conflict between the inherent nature of the PLLs and injection locking causes the clock signals to operate with high values of jitter. This is further explained with respect to FIG. 2. As shown in graph 36 of FIG. 2, jitter amplitude (shown along Y-axis) can vary with the change in the phase/delay (shown along X-axis) of the reference clock signal input to a PLL. Regions 38 and 42 are shown as having a high jitter amplitude and region 40 is shown as having a low jitter amplitude. Changes in process, voltage, and temperature can shift the high jitter amplitude regions 38 and 42 and low amplitude region 40 so much that the temporary value of delay that was working earlier ceases to work. To ensure that the PLLs keep operating in the low jitter amplitude region 40, also referred to as the quiet zone, it is important to be able to change the variable delay values during operation of data processing system 10. By way of example, processing unit 28 is configured to run an algorithm to adjust the variable delays (e.g., dynamically variable delay1, dynamically variable delay2, and dynamically variable delayN) such that the respective PLLs are operating at the center 44 of the quiet zone (region 40, for example). This process may include adjusting the delay to a value that adjusts an edge of the master clock to a location that permits data processing system 10 to operate near substantially the center 44 of the quiet zone (region 40, for example).

Figure 3:
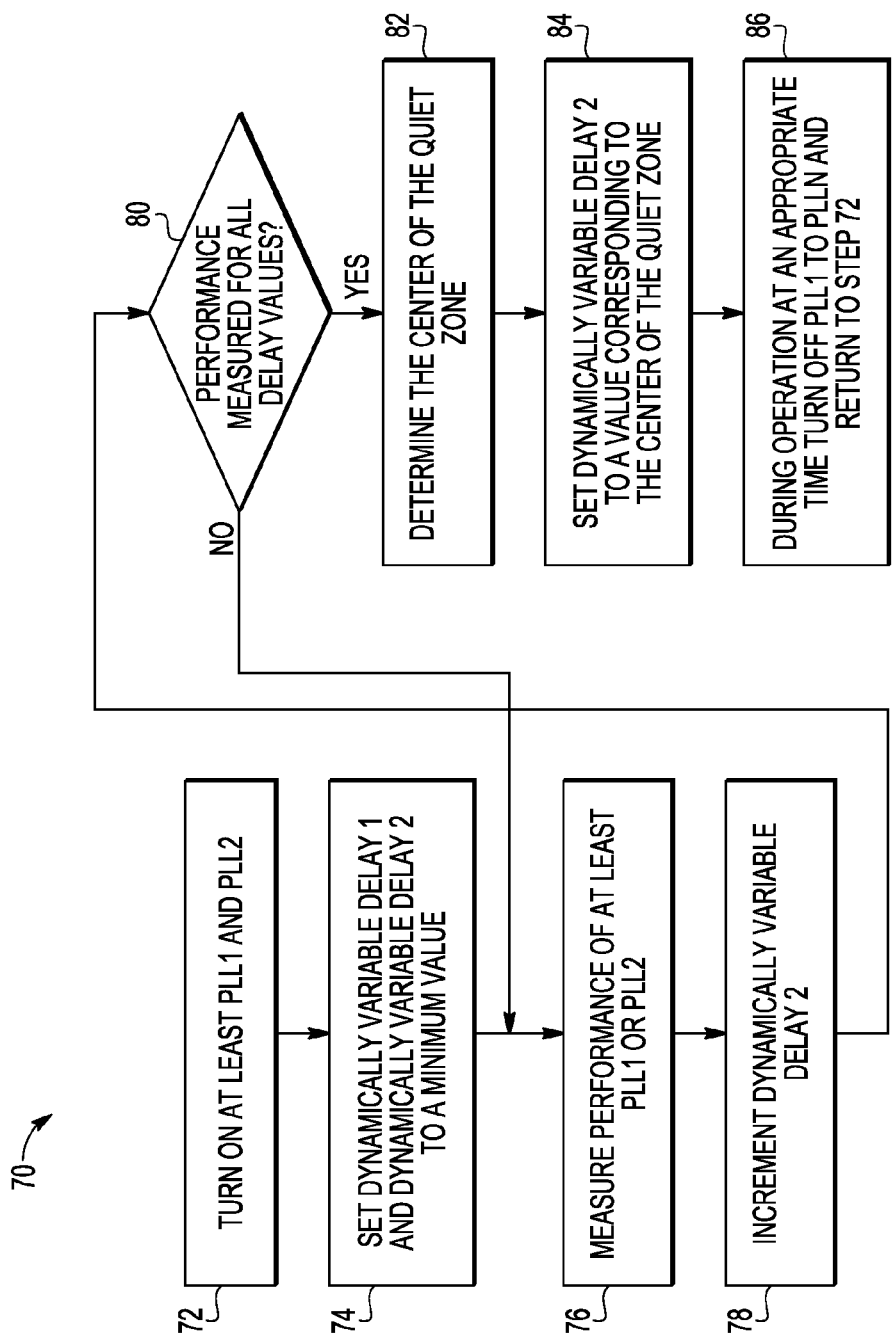
FIG. 3 is a flow chart showing operation of a data processing system with an apparatus to compensate for injection locking.

Referring now to FIG. 3, a flowchart 70 for a method of compensating for injection locking is shown. In one embodiment, this method may be executed by processing unit 28. As an example, in step 72 processing unit 28 may turn on at least PLL1 14 and PLL2 16. Next, in step 74, processing unit 28 may set each of dynamically variable delay1 and dynamically variable delay2 to a minimum value. By way of example, this may include processing unit 28 setting a delay line at the minimum delay tap. Next, in step 76, performance detector 26, alone or in combination with processing unit 28, may measure performance of at least one of PLL1 14 and PLL2 16. In one embodiment, the performance measurement may relate to measuring the amplitude of jitter associated with the clock signals output by one of PLL1 14 and PLL2 16, respectively. The measured jitter amplitude values may be stored in a memory by processing unit 28 and may be used to adjust the temporary values associated with dynamically variable delay1 30 and dynamically variable delay2 32. By way of example, in step 78, a value of dynamically variable delay2 32 may be incremented. This may include using the next delay tap of the delay line, such that the value of the delay is incremented. As shown with respect to step 80, performance detector 26 may be used to measure performance for all of the possible delay values associated with dynamically variable delay2 32. In one embodiment, all of the possible delay values may relate to all of the delay taps that could be obtained from a delay line. Once the jitter amplitude values for all of the possible delay values have been measured and analyzed, in step 82, a center of the quiet zone (e.g., center 44 of region 40) may be determined. As part of this process, processing unit 28 may determine a temporary delay value that corresponds to the center of the quiet zone. By way of example, this step may include processing unit 28 determining lower and upper limit of delay values. The lower limit and the upper limit may correspond to those delay values for which the jitter amplitude is significantly lower than other delay values. Center 44 of quiet zone may be calculated by averaging the lower limit and upper limit delay values.

Next, as shown in step 84, processing unit 28 may set dynamically variable delay2 32 to the temporary delay value that corresponds to substantially the center of the quiet zone. During operation of data processing step, at an appropriate time, as shown in step 86, PLL1 14, PLL2 16, and PLLN 18 may be turned off and the process may return to step 72. This way any changes in the clock signals caused by process, voltage, and temperature variation may be accounted for. For example, when steps 72 to 84 are performed for the second time, the center of the quiet zone may have shifted. As a result, data processing unit 10 may be about to begin experiencing operational difficulties. However, because of timely resetting of dynamically variable delays, data processing system 10 may continue to operate properly. In one embodiment, the timing of the steps related to steps 72 to 84 may be based on detecting any change in temperature, voltage, master clock frequency, phase-locked loop frequency, or a change in the system configuration. The change in the system configuration may relate to a change in the power management configuration. Although FIG. 3 shows a series of steps performed in a certain order, it may contain additional or fewer steps that may be performed in a different order. For example, although FIG. 3 shows setting dynamically variable delay values to a minimum and then incrementing them, they could be set to a maximum value and then decremented. Moreover, as explained with respect to FIGS. 4 and 5, performance detector 26 may detect other characteristics associated with the stability of clock signals, such as the deviation of the center of eye diagrams and bit error rate (BER).

Figure 4:
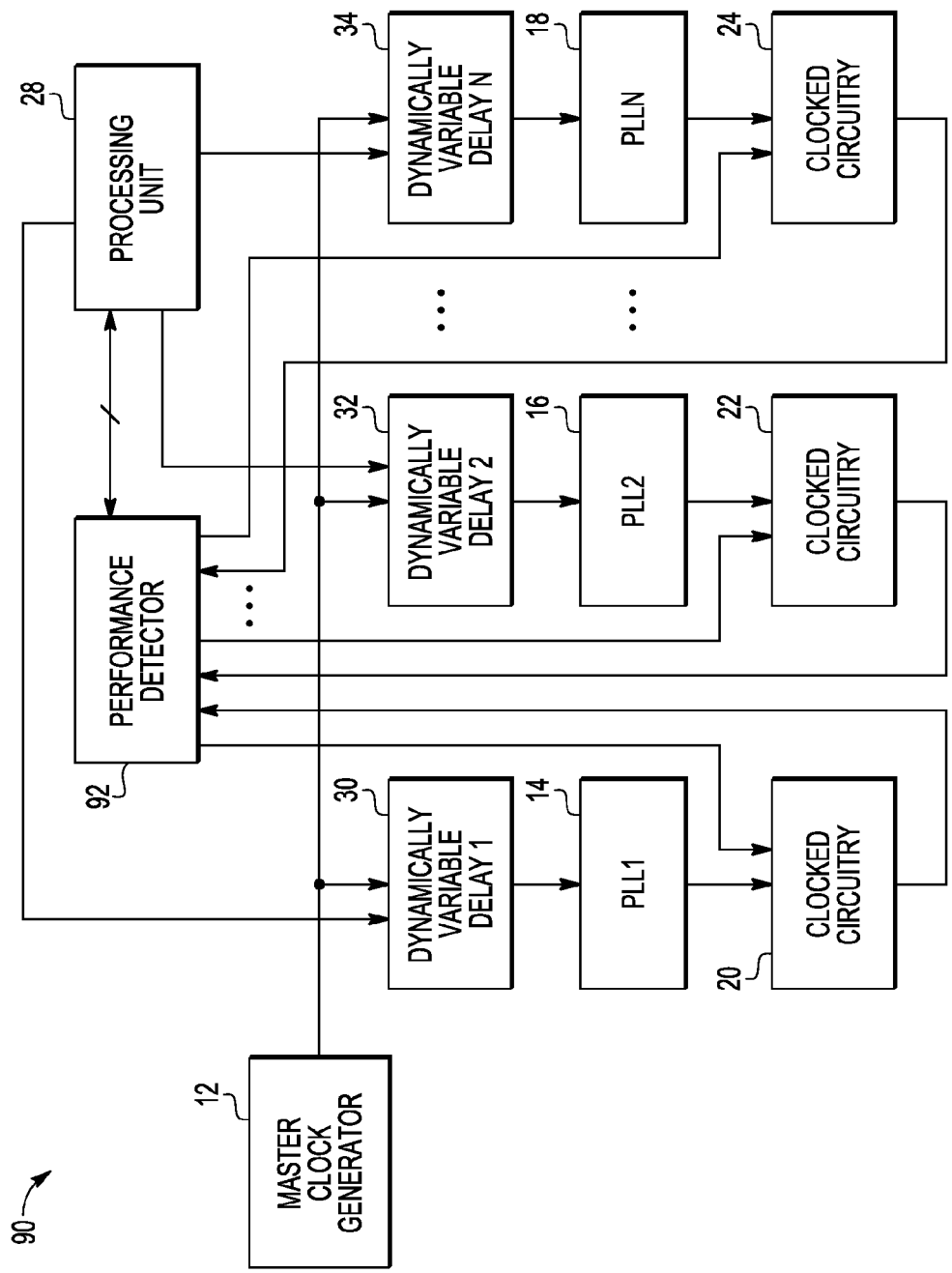
FIG. 4 is a block diagram of another exemplary data processing system with an apparatus to compensate for injection locking.

FIG. 4 is a block diagram of another exemplary data processing system 40 with an apparatus to compensate for injection locking. Like data processing system 10, data processing system 90 also includes components to compensate for injection locking. Instead of relying on jitter measurements, performance detector 92 relies on an eye-finding technique to evaluate the performance of the various clocking/data signals. Data processing system 90 has some of the same components as data processing system 10. The common components are not described, unless their operation is different from their operation as part of data processing system 10. In this embodiment, performance detector 92 may provide a data signal to clocked circuitry 20, 22, and 24, respectively. The output data streams may be provided back to performance detector 92. Performance detector 92, as part of step 74, alone or in combination with processing unit 28, may measure deviations in the eye diagrams associated with data signals output by at least one of clocked circuitry 20 and clocked circuitry 22, respectively. This may include determining a position of each transition between high and low amplitudes for a series of data bits communicated by clocked circuitry 20. The measured deviations may be stored in a memory by processing unit 28 and may be used to adjust the values associated with dynamically variable delay1 30 and dynamically variable delay2 32. In one embodiment, processing unit 28 may translate the measured deviations into jitter amplitude values. Having done this, the embodiment shown in FIG. 4 may operate in the same manner as described above with respect to FIGS. 2 and 3. Although FIG. 4 shows a specific number of components arranged in a certain manner, data processing system 90 may include additional or fewer elements, arranged differently. In one embodiment, data processing system 90 is implemented on a single integrated circuit, such that all components of data processing system 90, shown in FIG. 4, except for master clock 12, are on the same integrated circuit.

Figure 5:
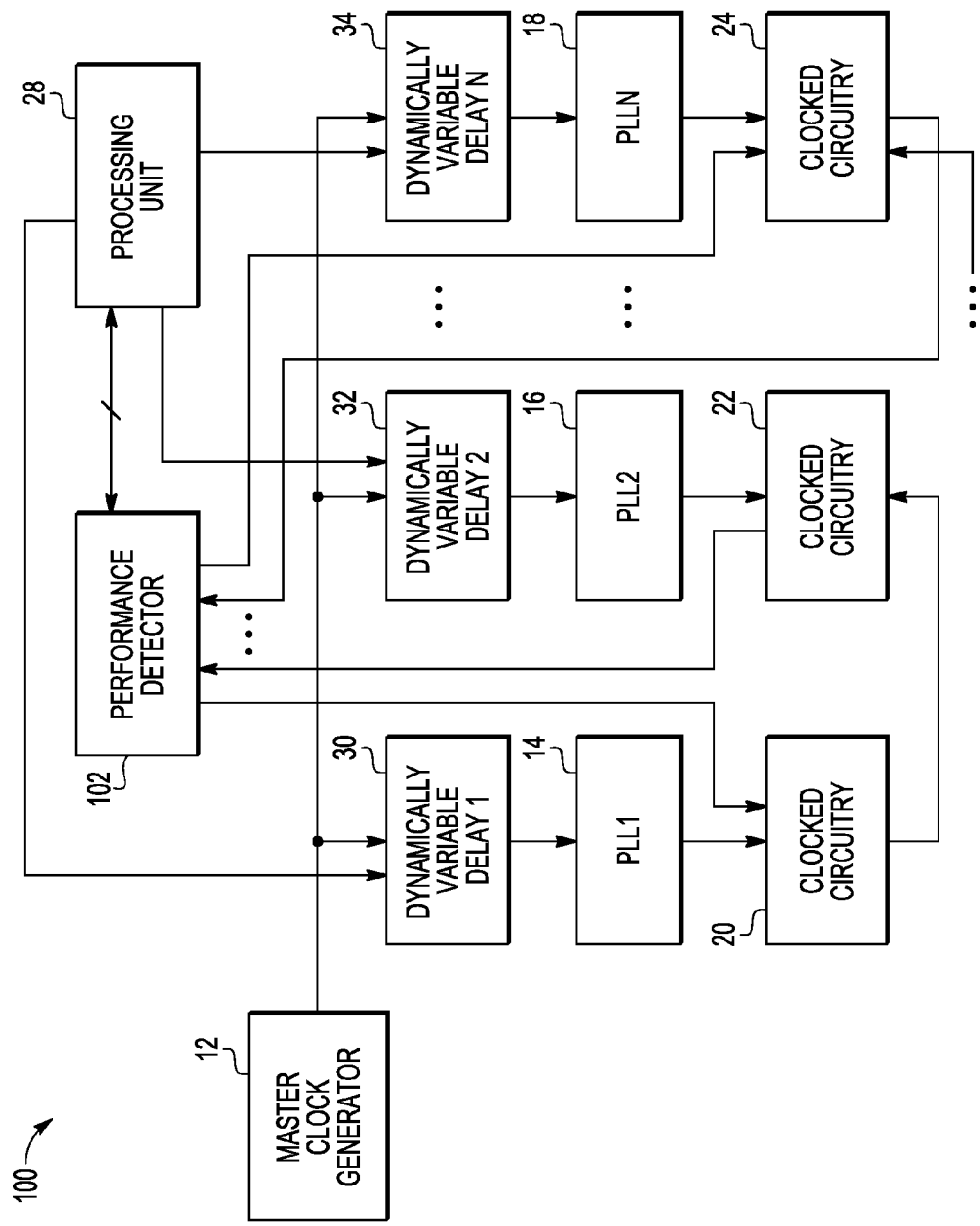
FIG. 5 is a block diagram of another exemplary data processing system with an apparatus to compensate for injection locking.

FIG. 5 is a block diagram of another exemplary data processing system with an apparatus to compensate for injection locking. Like data processing system 10, data processing system 100 also includes components to compensate for injection locking. Instead of relying on jitter measurements, performance detector 102 relies on bit error rate (BER) to evaluate the performance of the various clocking signals. Data processing system 100 has some of the same components as data processing system 10. The common components are not described, unless their operation is different from their operation as part of data processing system 10. In this embodiment, performance detector 102 may provide a data signal to clocked circuitry 20, 22, and 24, respectively. The output data streams may be provided back to performance detector 102. Performance detector 102, as part of step 74, alone or in combination with processing unit 28, may measure bit error rate associated with the data signal transmitted by clocked circuitry 20 and received by clocked circuitry 22. The measured BER may be stored in a memory by processing unit 28 and may be used to adjust the values associated with dynamically variable delay1 30 and dynamically variable delay2 32. In one embodiment, processing unit 28 may translate the measured BER into jitter amplitude values. Having done this, the embodiment shown in FIG. 5 may operate in the same manner as described above with respect to FIGS. 2 and 3. Although FIG. 5 shows a specific number of components arranged in a certain manner, data processing system 100 may include additional or fewer elements, arranged differently. In one embodiment, data processing system 100 is implemented on a single integrated circuit, such that all components of data processing system 100, shown in FIG. 5, except for master clock 12, are on the same integrated circuit.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is to be understood that the circuits depicted herein are merely exemplary. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. In a data processing system having a plurality of phase-locked loops coupled to a master clock, each of the plurality of phase-locked loops providing a respective clock signal to respective clocked circuitry, a method to compensate for injection locking comprising:
   (a) turning on at least two of the plurality of phase-locked loops;
   (b) setting a dynamically variable delay circuit that is between the master clock and one of the at least two of the plurality of phase-locked loops to have a predetermined value of delay, the dynamically variable delay circuit having a plurality of delay values;
   (c) measuring performance of at least one of the plurality of phase-locked loops by using the plurality of delay values to provide a plurality of performance values;
   (e) determining a center of a quiet zone of phase difference between clocks of the at least two of the plurality of phase-locked loops;
   (f) adjusting, if necessary, a currently selected temporary delay value for the one of the at least two of the plurality of phase-locked loops to an adjusted new temporary delay value that corresponds to substantially the center of the quiet zone; and
   (g) during operation of the data processing system, turning off the at least two of the plurality of phase-locked loops and repeating (a) through (f).

2. The method of claim 1 further comprising:
   after turning on the at least two of the plurality of phase-locked loops for a first time, setting the dynamically variable delay circuit to have a minimum value of delay as the predetermined value of delay; and
   incrementing delay values in a sequentially increasing order to measure performance for a remainder of the plurality of delay values.

3. The method of claim 1 further comprising:
   after turning on the at least two of the plurality of phase-locked loops for a first time, setting the dynamically variable delay circuit to have a maximum value of delay as the predetermined value of delay; and
   decrementing delay values in a sequentially decreasing order to measure performance for a remainder of the plurality of delay values.

4. The method of claim 1 further comprising:
   measuring performance of the at least one of the plurality of phase-locked loops by measuring a bit error rate (BER) of data communicated by first clocked circuitry clocked by a first of the at least two of the plurality of phase-locked loops and second clocked circuitry clocked by a second of the at least two of the plurality of phase-locked loops;
   determining lower and upper limits of delay values to define the quiet zone of phase difference where clock jitter amplitude is lower than outside of the quiet zone of phase difference; and
   calculating the center of the quiet zone as an average of the lower and upper limits of delay values.

5. The method of claim 1 further comprising:
   measuring performance of the at least one of the plurality of phase-locked loops by measuring clock jitter at an output of each of the at least two of the plurality of phase-locked loops for each of the plurality of delay values;
   determining lower and upper limits of delay values to define the quiet zone of phase difference where clock jitter amplitude is lower than outside of the quiet zone of phase difference; and
   calculating the center of the quiet zone as an average of the lower and upper limits of delay values.

6. The method of claim 1 further comprising:
   measuring performance of the at least one of the plurality of phase-locked loops by determining a position of each transition between high and low amplitudes for a series of data communicated by first clocked circuitry to define clock jitter for the at least two of the plurality of phase-locked loops;
   determining lower and upper limits of delay values to define the quiet zone of phase difference where clock jitter amplitude is lower than outside of the quiet zone of phase difference; and
   calculating the center of the quiet zone as an average of the lower and upper limits of delay values.

7. A data processing system comprising:
   a master clock generator for providing a master clock;
   a plurality of phase-locked loops coupled to the master clock generator, each of the plurality of phase-locked loops providing a respective clock signal;
   a plurality of dynamically variable delay circuits, each coupled between the master clock generator and a respective one of the plurality of phase-locked loops and having a plurality of predetermined delay amounts;
   a plurality of clocked circuitry portions comprising respective clocked circuits coupled to the respective clock signal of a predetermined one of the plurality of phase-locked loops;
   a performance detector coupled to the plurality of clocked circuitry portions for determining a center of a quiet zone of phase difference between clocks of at least two of the plurality of phase-locked loops; and
   a processing unit coupled to the performance detector and the plurality of dynamically variable delay circuits, the processing unit selectively turning off the at least two of the plurality of phase-locked loops, turning on the at least two of the plurality of phase-locked loops and setting a respective one of the plurality of dynamically variable delay circuits to have a new predetermined value of delay which readjusts delay to a value that adjusts an edge of the master clock to a location that permits the data processing system to operate near substantially the center of the quiet zone.

8. The data processing system of claim 7 wherein after turning on the at least two of the plurality of phase-locked loops for a first time, the processing unit sets the respective one of the dynamically variable delay circuits to have a minimum value of delay as a predetermined value of delay and incrementing delay values in a sequentially increasing order to measure performance for a remainder of the plurality of delay values.

9. The data processing system of claim 7 wherein after turning on the at least two of the plurality of phase-locked loops for a first time, the processing unit sets the dynamically variable delay circuit to have a maximum value of delay as a predetermined value of delay and decrements delay values in a sequentially decreasing order to measure performance for a remainder of the plurality of delay values.

10. The data processing system of claim 7 wherein the performance detector measures performance of the at least one of the plurality of phase-locked loops by measuring a bit error rate (BER) of data communicated by first clocked circuitry clocked by a first of the at least two of the plurality of phase-locked loops and second clocked circuitry clocked by a second of the at least two of the plurality of phase-locked loops, the performance detector determining lower and upper limits of delay values to define the quiet zone of phase difference where clock jitter amplitude is lower than outside of the quiet zone of phase difference and calculates the center of the quiet zone as an average of the lower and upper limits of delay values.

11. The data processing system of claim 7 wherein the performance detector measures performance of the at least two of the plurality of phase-locked loops by measuring clock jitter at an output of at least one of the plurality of phase-locked loops for each of the plurality of delay values and determines lower and upper limits of delay values to define the quiet zone of phase difference where clock jitter amplitude is lower than outside of the quiet zone of phase difference, the performance detector calculating the center of the quiet zone as an average of the lower and upper limits of delay values.

12. The data processing system of claim 7 wherein the performance detector measures performance of at least one of the plurality of phase-locked loops by determining a position of each transition between high and low amplitudes for a series of data communicated by first clocked circuitry to define clock jitter for the at least one of the plurality of phase-locked loops and determines lower and upper limits of delay values to define the quiet zone of phase difference where clock jitter amplitude is lower than outside of the quiet zone of phase difference, the performance detector calculating the center of the quiet zone as an average of the lower and upper limits of delay values.

13. A method comprising:
providing a master clock signal to at least a first phase-locked loop and a second phase-locked loop;
injecting a predetermined variable delay to the master clock signal prior to said providing the master clock signal to the second phase-locked loop;
providing first and second clock signals respectively to first and second clocked circuits respectively from the first phase-locked loop and the second phase-locked loop;
measuring performance of the first and second clock signals in response to delaying the master clock signal to the second phase-locked loop using a plurality of differing delay values resulting in a plurality of performance values;
determining a center of a quiet zone of phase difference between the first and second clock signals;
adjusting, if necessary, a currently selected temporary delay value for the master clock signal coupled to the second phase-locked loop to an adjusted new temporary delay value that corresponds to substantially the center of the quiet zone; and
selectively repeating said measuring, determining and adjusting during functional operation of the first and second clocked circuits.

14. The method of claim 13 further comprising:
after turning on the first and second phase-locked loops for a first time, setting the dynamically variable delay to have a minimum value of delay as the predetermined variable delay; and
incrementing delay values in a sequentially increasing order to measure performance for a remainder of the plurality of delay values.

15. The method of claim 13 further comprising:
after turning on the first and second phase-locked loops for a first time, setting the dynamically variable delay circuit to have a maximum value of delay as the predetermined variable delay; and
decrementing delay values in a sequentially decreasing order to measure performance for a remainder of the plurality of delay values.

16. The method of claim 13 further comprising:
measuring performance of the first and second phase-locked loops by measuring a bit error rate (BER) of data communicated by the first clocked circuit clocked by the first phase-locked loop and second clocked circuit clocked by the second phase-locked loops;
determining lower and upper limits of delay values to define the quiet zone of phase difference where clock jitter amplitude is lower within the quiet zone of phase difference than outside the quiet zone of phase difference; and
calculating the center of the quiet zone as an average of the lower and upper limits of delay values.

17. The method of claim 13 further comprising:
measuring performance of the first and second phase-locked loops by measuring clock jitter at an output of each of the first and second phase-locked loops for each of the plurality of delay values;
determining lower and upper limits of delay values to define the quiet zone of phase difference where clock jitter amplitude is lower than outside of the quiet zone of phase difference; and
calculating the center of the quiet zone as an average of the lower and upper limits of delay values.

18. The method of claim 13 further comprising:
measuring performance of the at least two of the plurality of phase-locked loops by determining a position of each transition between high and low amplitudes for a series of data communicated by first clocked circuitry to define clock jitter for the at least two of the plurality of phase-locked loops;
determining lower and upper limits of delay values to define the quiet zone of phase difference where clock jitter amplitude is lower than outside of the quiet zone of phase difference; and
calculating the center of the quiet zone as an average of the lower and upper limits of delay values.

19. The method of claim 13 further comprising:
coupling additional pairs of phase-locked loops to the same master clock for clocking additional clocked circuits;
measuring performance of clock signals provided by said additional pairs of phase-locked loops in response to delaying the master clock signal using a plurality of differing delay values to provide a plurality of performance values;
determining a center of a quiet zone of phase difference between the clock signals provided by said additional pairs of phase-locked loops;
adjusting, if necessary, a currently selected temporary delay value for the master clock signal coupled to predetermined ones of the additional pairs of phase-locked loops to adjusted new temporary delay values that correspond to the center of the quiet zone; and
selectively repeating said measuring, determining and adjusting during functional operation of the additional clocked circuits.

20. The method of claim 13 further comprising:
selectively repeating said measuring, determining and adjusting during functional operation of the first and second clocked circuits in response to detecting any one of a change in temperature, voltage, master clock frequency, phase-locked loop frequency or a change in power management configuration.

* * * * *